(12) United States Patent
Wang et al.

(10) Patent No.: US 7,636,135 B2
(45) Date of Patent: Dec. 22, 2009

(54) TFT-LCD ARRAY SUBSTRATE AND METHOD FOR MANUFACTURING THE SAME

(75) Inventors: Zhangtao Wang, Beijing (CN); Haijun Qiu, Beijing (CN); Tae Yup Min, Beijing (CN); Seung Moo Rim, Beijing (CN)

(73) Assignee: Beijing BOE Optoelectronics Technology Co., Ltd, Beijing (CN)

( * ) Notice: Subject to any disclaimer, the term of this patent is extended or adjusted under 35 U.S.C. 154(b) by 47 days.

(21) Appl. No.: 11/853,297

(22) Filed: Sep. 11, 2007

(65) Prior Publication Data

US 2008/0061295 A1   Mar. 13, 2008

(30) Foreign Application Priority Data

Sep. 11, 2006   (CN)   .................. 2006 1 0152022
Sep. 11, 2006   (CN)   .................. 2006 1 0152023

(51) Int. Cl.
*H01L 29/04* (2006.01)
*H01L 21/336* (2006.01)

(52) U.S. Cl. .................................. 349/43; 438/149
(58) Field of Classification Search ............. 257/59, 257/72, 66, E21.414, E29.003; 438/59, 149–160; 349/141, 143, 43, 46, 160, 129
See application file for complete search history.

(56) References Cited

U.S. PATENT DOCUMENTS 6,887,742 B2 *   5/2005   Baek et al. .................. 438/149

2004/0036070 A1 *   2/2004   Yun .............................. 257/59
2006/0091391 A1 *   5/2006   Lee et al. ..................... 257/59
2007/0148598 A1 *   6/2007   Colburn et al. .............. 430/311

(Continued)

FOREIGN PATENT DOCUMENTS

| JP | 02-193122 | 7/1990 |
| KR | 1997-11948 | 3/1997 |
| KR | 2001-98586 | 11/2001 |

OTHER PUBLICATIONS

N. Dumbaravescu, "3-D resolution gray-tone lithography", 2000, Proc. of SPIE, vol. 4019, pp. 570-577.*

(Continued)

*Primary Examiner*—Thomas L Dickey
*Assistant Examiner*—Nikolay Yushin
(74) *Attorney, Agent, or Firm*—Daniel F. Nesbitt; Hasse & Nesbitt LLC

(57) ABSTRACT

A TFT-LCD array substrate and a method for manufacturing the same are disclosed. In the TFT-LCD array substrate, a first insulating layer, a semiconductor layer, and an ohmic contact layer are formed sequentially on the gate line and the gate electrode, and the ohmic contact layer is formed on the source region and the drain region of the semiconductor layer and exposes the channel; a second insulating layer is formed on the substrate, covers the sidewalls of the gate line and gate electrode, the first insulating layer, the semiconductor layer, and the ohmic contact layer, and exposes the ohmic contact layer in the source region and the drain region; the data line, the source electrode, the pixel electrode, and the drain electrode are formed on the second insulating layer; a passivation layer is formed on the TFT, the gate line, and the data line and exposes the pixel electrode.

20 Claims, 8 Drawing Sheets

U.S. PATENT DOCUMENTS

| | | | |
|---|---|---|---|
| 2007/0246707 A1 | 10/2007 | Deng | |
| 2007/0272926 A1 | 11/2007 | Deng | |
| 2007/0298554 A1 | 12/2007 | Long | |
| 2008/0030639 A1 | 2/2008 | Qiu | |
| 2008/0100766 A1 | 5/2008 | Ming | |
| 2008/0105873 A1 | 5/2008 | Wang | |
| 2008/0105874 A1 | 5/2008 | Wang | |
| 2008/0111136 A1* | 5/2008 | Qiu et al. .................... | 257/72 |
| 2008/0111934 A1 | 5/2008 | Wu | |
| 2008/0117347 A1 | 5/2008 | Zhang | |
| 2008/0123007 A1 | 5/2008 | Cui | |
| 2008/0123030 A1 | 5/2008 | Song | |
| 2008/0142802 A1 | 6/2008 | Qiu | |
| 2008/0142819 A1 | 6/2008 | Liu | |

OTHER PUBLICATIONS

T. J. Suleski et al., "Gray-scale masks for diffractive optics fabrication: I. Commercial slide imagers", 1995, Applied Optics, vol. 34, No. 32, pp. 7507-7517.*

M. Quirk, "Semiconductor manufactoring technology", 2001, Prentice-Hall, p. 460.*

U.S. Appl. No. 11/958,613, filed Dec. 18, 2007, Zhangtao Wang.

U.S. Appl. No. 11/958,634, filed Dec. 18, 2007, Chunping Long.

U.S. Appl. No. 12/104,575, filed Apr. 17, 2008, Xinxin Li.

* cited by examiner

TFT-LCD ARRAY SUBSTRATE AND METHOD FOR MANUFACTURING THE SAME

CROSS-REFERENCE TO RELATED APPLICATIONS

The present application claims the priority of the applications Nos. 200610152022.5 and 200610152023.X filed in the Chinese Patent Office on Sep. 11, 2006, the disclosures of which are incorporated herein by reference in entirety.

FIELD OF THE INVENTION

The present invention relates to a thin film transistor liquid crystal display (TFT-LCD) array substrate and a method for manufacturing the same, and more particularly, to a TFT-LCD array substrate manufactured with four masks and a method for manufacturing the same.

BACKGROUND OF THE INVENTION

The liquid crystal display has become the mainstream of flat plate display, and active driven TFT-LCD has become the mainstream among the display manners of LCDs. The manufacturing process of TFT-LCD is compatible with that for the conventional integrated circuits. In addition, the TFT-LCD has the advantages of excellent display quality, low power consumption, light weight, and low radiation, and is a friendly man-machine interactive interface. The applications of TFT-LCD comprise notebook computer, desktop computer, workstation, industrial monitor, global satellite positioning system (GPS), personal digital assistant (PDA), game machine, visual telephone, portable VCD and DVD, and other portable equipment.

In order to effectively reduce the cost of TFT-LCD and improve the yield, efforts have been made to simplify the manufacturing process of the TFT-LCD array substrate. The array substrate was fabricated by a seven-mask or six-mask (7Mask or 6Mask) process in the beginning and generally by a five-mask (5Mask) process currently. Recently, a four-mask (4Mask) process using a gray tone mask has been applied to manufacture the TFT-LCD array substrate and is becoming widespread. An important step in the 4Mask process is to perform the photolithography for the active layer (Active Mask) and the photolithography for the source/drain electrode (S/D Mask) in the conventional 5Mask process with one gray tone mask.

The 4Mask process in the related art is briefly described as follows. First, a gate metal layer is deposited on a substrate, and a gate line and a gate electrode are formed with the first photolithography. Secondly, a gate insulating layer, an active layer, an ohmic contact layer, and a source/drain metal layer are deposited successively on the gate line and the gate electrode. With the second photolithography, a data line, an active region, a source/drain electrode, and TFT channel are formed by source/drain wet etching and multiple-step etching (active layer etching→ashing→Mo dry etching→n+etching). Thirdly, a passivation layer is deposited, and a via hole is formed in the passivation layer with the third photolithography. Lastly, a transparent pixel electrode layer is deposited, and a pixel electrode is formed with the fourth photolithography.

Although the above 4Mask process is advantageous over the conventional 5Mask process, the 4Mask process still has some drawbacks. For example, the multiple-step etching is complicated and difficult to perform, and will inevitably bring about some defects, such as the residue of metal Mo, rough surface of the channel, etc. In addition, the lateral etching during the Mo dry etching will affect the aspect ratio of the channel and cause the change of electric characteristics of the TFT, such as low on-state current.

SUMMARY OF THE INVENTION

In view of the above-related art, according to one aspect of the present invention, there is provided a TFT-LCD array substrate and a method for manufacturing the same, so as to shorten the manufacturing period of the TFT-LCD array substrate and reduce the production cost thereof.

In one embodiment according to the present invention, there is provided a TFT-LCD array substrate, comprising: a substrate; a gate line and a data line, which are formed on the substrate and intersect with each other to define a pixel region; a pixel electrode, which is formed in the pixel region; and a TFT, which is formed on the substrate and has a gate electrode connected with the gate line, a source electrode connected with the data line, and a drain electrode connected with the pixel electrode; wherein a first insulating layer, a semiconductor layer, and an ohmic contact layer are formed sequentially on the gate line and the gate electrode, and the ohmic contact layer is formed on the source region and the drain region over the semiconductor layer and exposes the channel; wherein a second insulating layer is formed on the substrate, covers the sidewalls of the gate line and gate electrode, the first insulating layer, the semiconductor layer, and the ohmic contact layer and exposes the ohmic contact layer in the source region and the drain region; wherein the data line, the source electrode, the pixel electrode, and the drain electrode are formed on the second insulating layer, and the source electrode and the drain electrode contact the ohmic contact in the source region and the drain region, respectively; wherein a passivation layer is formed on the TFT, the gate line, and the data line, and exposes the pixel electrode.

According to another embodiment of the present invention, a groove is formed over the gate line, and the groove cuts off the ohmic contact layer and the semiconductor layer over the gate line and exposes the first insulating layer.

In another embodiment of the present invention, there is provided a method for manufacturing a TFT-LCD array substrate, comprising the steps of: depositing sequentially on a substrate a gate metal layer, a first insulating layer, a semiconductor layer, and an ohmic contact layer, and patterning the layers to form a gate line, a gate electrode, and a channel of a TFT on the substrate; depositing a second insulting layer and patterning the second insulating layer to expose the ohmic contact layer in the source region and the drain region in the TFT; depositing a source/drain metal layer and patterning the source/drain metal layer to form a data line, a source electrode, and a drain electrode, wherein the data line and the gate line intersect with each other to define a pixel region, and the source electrode and the drain electrode contact the ohmic contact in the source region and the drain region, respectively; and depositing a passivation layer, after patterning the passivation layer with a photoresist depositing a pixel electrode material layer, and stripping off the photoresist as well as the pixel electrode material layer on the photoresist to form a pixel electrode.

The present invention will be described in detail with reference to the accompanying drawings and the exemplary embodiments.

DESCRIPTION OF THE PREFERRED EMBODIMENTS

The exemplary embodiments according to the present invention will be described hereinafter in detail with reference to the accompanying drawings. The present invention may, however, be embodied in various forms and should not be construed as limited to the embodiments set forth herein. It will be understood that when an element or layer is referred to as being "on" or "connected to" another element or layer, it can be directly on or connected to the other element or layer or an intervening element or layer may be present therebetween.

A liquid crystal display (LCD) generally comprises an upper substrate, a lower substrate, and a liquid crystal layer interposed therebetween. A common electrode and color filters are formed on the upper substrate, which is generally called a color filter substrate. The lower substrate is generally called an array substrate, on which a plurality of gate lines parallel to each other and a plurality of data lines parallel to each other are formed. The gate lines and data lines intersect with each other orthogonally, defining a plurality of pixel units in a matrix on the substrate. In each of the pixel unit, a pixel electrode and a switching element such as a thin film transistor (TFT) connected with the pixel electrode are included. The gate electrode of the TFT is connected with one of the gate lines, and the source electrode of the TFT is connected with one of the data lines.

The First Embodiment

Figure 1:
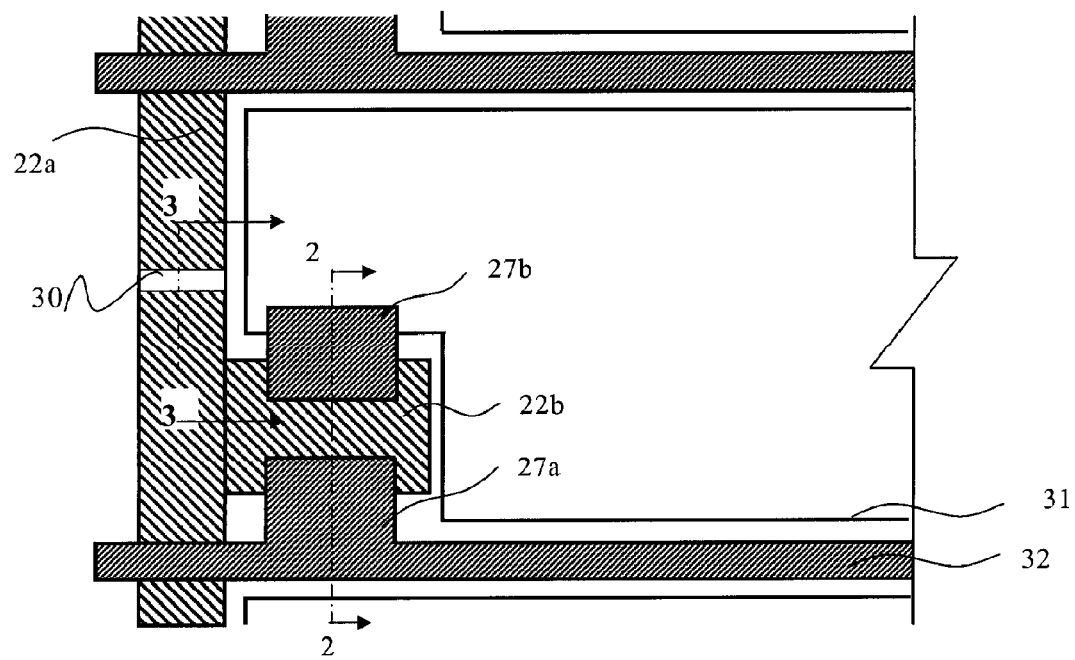
FIG. 1 is a schematic view showing a pixel unit in the TFT-LCD array substrate according to the first embodiment of the present invention.
Figure 2:
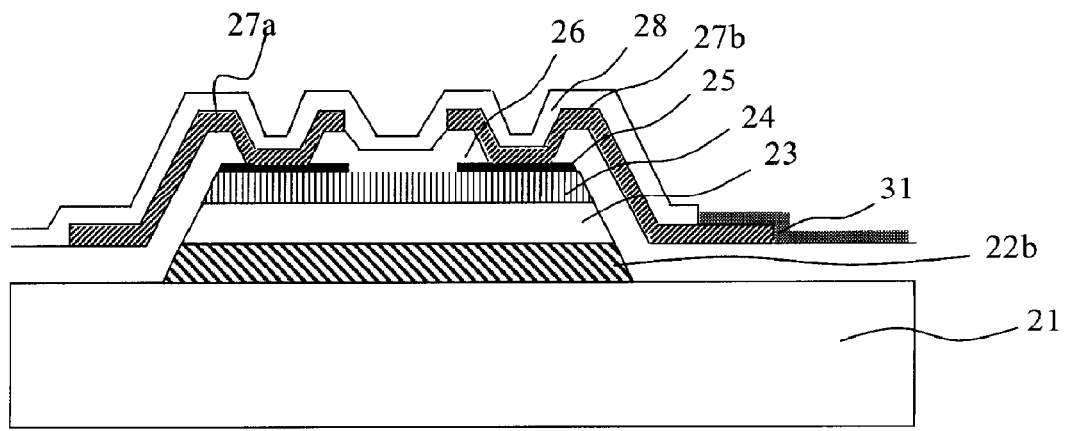
FIG. 2 is a partial cross-sectional view along the line 2-2 in FIG. 1.
Figure 3:
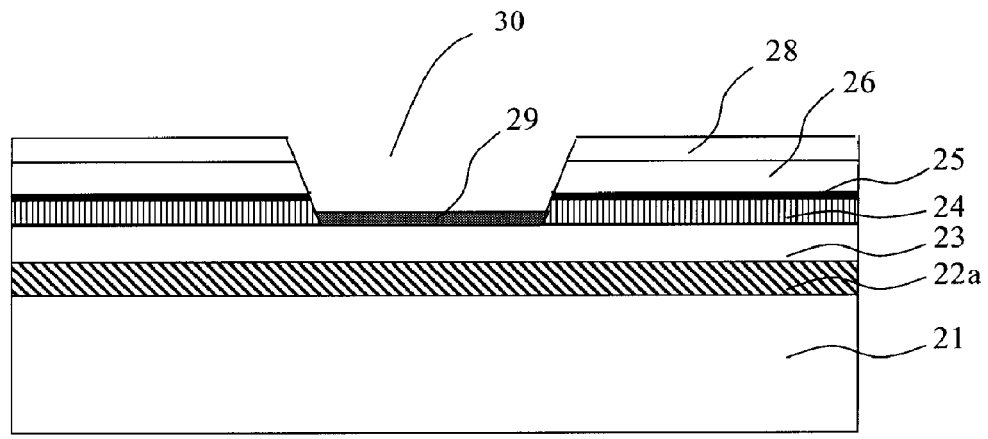
FIG. 3 is a partial cross-sectional view along the line 3-3 in FIG. 1.

FIG. 1 is a schematic view showing a pixel unit in the TFT-LCD array substrate according to the first embodiment of the present invention. FIG. 2 is a partial cross-sectional view along the line 2-2 in FIG. 1. FIG. 3 is a partial cross-sectional view along the line 3-3 in FIG. 1.

As shown in FIGS. 1, 2, and 3, the TFT-LCD array substrate according to the first embodiment of the present invention comprises: a substrate (e.g., a transparent substrate) 21; a gate line 22a and a gate electrode 22b connected thereto (or branched therefrom), which are formed on the substrate 21; a first insulating layer 23, a semiconductor layer 24, and an ohmic contact layer 25 that are formed sequentially on the gate line 22a and the gate electrode 22b, with the ohmic contact layer 25 being formed on the source region and the drain region over the semiconductor layer 24 and exposing the channel; a second insulating layer 26, formed on the substrate 21 and covering the sidewalls of the gate line 22a and the gate electrode 22b, the first insulating layer 23, the semiconductor layer 24, and the ohmic contact layer 25; a source electrode via hole 27c and a drain electrode via hole 27d, which are formed on the ohmic contact layer 25 on the source region and the drain region, respectively; a data line 32 and a source electrode 27a connected thereto, which are formed on the second insulating layer 26 and contacting the ohmic contact layer 25 in the source region via the source electrode via hole 27c; a drain electrode 27b, which are formed on the second insulating layer 26 and contacting the ohmic contact layer 25 in the drain region via the drain electrode via hole 27d; a passivation layer 28, which is formed on the data line 32, the source electrode 27a, and the drain electrode 27b; a pixel electrode 31, which is formed on the second insulating layer 26 and connected with the drain electrode 27b. Here, the gate line 22a and the data line 32 intersect with each other to define a pixel region on the substrate 21.

In an example according to the first embodiment of the present invention, a groove 30 is formed over the gate line 22a between the neighboring data lines 32. The groove 30 cuts off the ohmic contact layer 25 and the semiconductor layer 24 over the gate line 22a to prevent the cross-talk between the neighboring gate lines 22a. In another example, the first insulating layer 23 exposed in the groove 30 is covered with a pixel electrode material layer 29.

In the first embodiment of the present invention, the gate electrode 22b is covered with the first insulating layer 23 and the second insulating layer 26, which increase the distance between the source/drain electrode 27a/27b and the gate electrode 22b, effectively reducing the occurrences of short circuits between the source/drain electrode 27a/27b and the gate electrode 22b and, thus, improving the yield.

FIGS. 4-9 show a method of manufacturing a TFT-LCD array substrate with a 4Mask process according to the first embodiment of the present invention.

A gate metal layer 22 is deposited to a thickness of about 3600 Å on a substrate (e.g., a glass, quartz or plastic substrate) 21 by a method of sputtering or thermal evaporation. The gate metal layer 22 may comprise a single-layer film of Cr, W, Ti, Ta, Mo, Al, or Cu, or a composite film of any combination of Cr, W, Ti, Ta, Mo, Al, and Cu.

Figure 4:
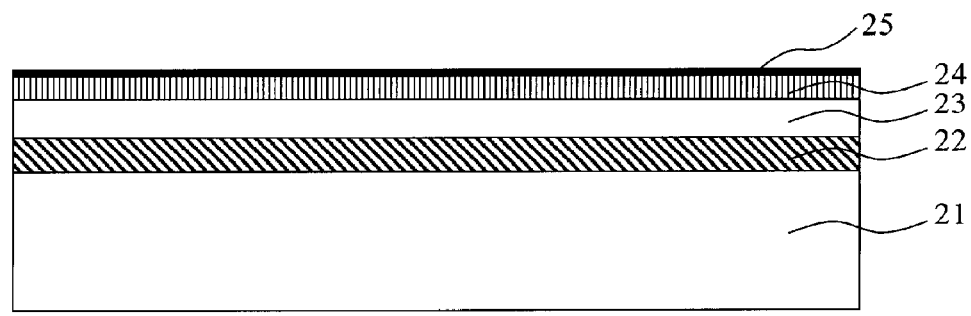
FIG. 4 is a cross-sectional view along the line 2-2 showing the array substrate after sequentially depositing a gate metal layer, a first insulating layer, a semiconductor layer, and an ohmic contact layer according to the first embodiment.

A first insulating layer (gate insulating layer) 23 with a thickness of about 4000 Å, a semiconductor layer 24 with a thickness of about 1800 Å, and an ohmic contact layer 25 with a thickness of about 500 Å are sequentially deposited on the gate metal layer 22 by plasma enhanced chemical vapor deposition (PECVD), as shown in FIG. 4. The first insulating layer 23 may comprise oxide, nitride or oxynitride, and the reactant gases used in the PECVD may be $SiH_4$, $NH_3$ or $N_2$, or $SiH_2Cl_2$, $NH_3$ or $N_2$. The semiconductor layer 24 comprises for example amorphous silicon (a-Si) or polycrystalline silicon (p-Si), and the ohmic contact layer 25 comprises for example micro-crystalline silicon, doped mono-crystalline silicon or doped p-Si. Thus, the reactant gases used in the PECVD may be either $SiH_4$ and $H_2$, or $SiH_2Cl_2$ and $H_2$, and may also further comprise impurity gase(s) for doping.

Then, the gate metal layer 22, the first insulating layer 23, the semiconductor layer 24, and the ohmic contact layer 25 deposited on the substrate 21 are etched so that these stacked layers are patterned.

In this case, a first mask, e.g., a gray tone mask is used to perform the masking, exposure, and etching to complete the above-mentioned patterning.

In this disclosure, the gray tone mask also comprises a half tone mask. In the gray tone mask, besides a full transparent region, a partial transparent region is formed. The partial transparent region can be realized as a slit structure in the form of a grating which reduces the transmittance of light by the scattering and diffraction of light passing therefrom, or as a translucent layer which reduces the transmittance of light passing therefrom. When the coated photoresist (e.g., positive photoresist) is exposed with the gray tone mask, the full transparent region of the mask will completely expose the corresponding portion of the photoresist layer, while the partial transparent region will partially expose the corresponding portion of the photoresist layer. After the development of the photoresist layer, the completely exposed photoresist layer will be completely removed, while the photoresist layer in the partially exposed region will be partially retained and is reduced in thickness, so that the exposed photoresist is shaped into a three-dimension pattern.

A photoresist layer (e.g., positive photoresist, not shown) is coated on the stacked layers shown in FIG. 4. The photoresist layer is then exposed with the first mask, so that a photoresist unexposed region, a photoresist partially exposed region (i.e., the gray tone region), and a photoresist fully exposed region are formed in the photoresist layer. The photoresist layer after exposure is developed to form a gray tone photoresist pattern (not shown), in which the photoresist in the photoresist unexposed region is fully retained to form a photoresist fully retained region, which corresponds to the portion of the array substrate where the gate line and gate electrode will be formed. The photoresist in the photoresist partially exposed region is partially retained to form a photoresist partially retained region, which corresponds to the portion of the array substrate where the channel of the TFT will be formed. The photoresist in the photoresist fully exposed region is fully removed to form a photoresist-free region over the substrate.

Figure 5:
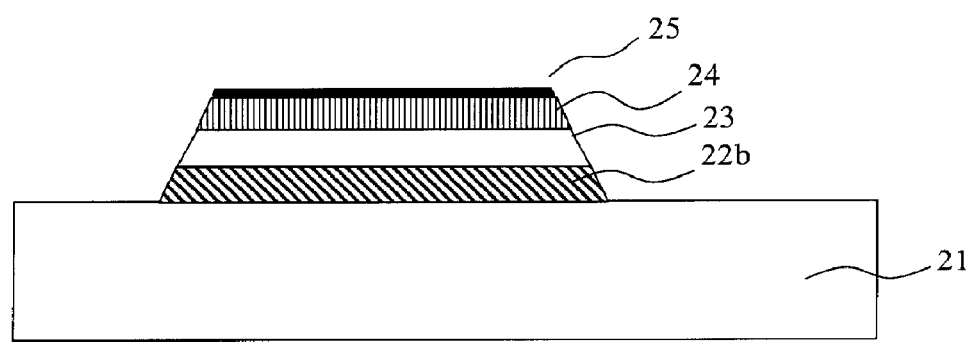
FIG. 5 is a cross-sectional view along the line 2-2 showing the array substrate after etching the gate metal layer, the first insulating layer, the semiconductor layer, and the ohmic contact layer with a gray tone photoresist pattern according to the first embodiment.

Multiple-step dry etching is then performed with the above formed photoresist pattern as an etching mask, to remove the underlying ohmic contact layer 25, the semiconductor layer 24, the first insulating layer 23, and the gate metal layer 22 that correspond to the photoresist-free region in the photoresist pattern, so as to form the gate line 22a and the gate electrode 22b on the substrate, as shown in FIG. 5. During this etching, the etching gas for the gate metal layer 22 can be selected from $SF_6/O_2$ or $Cl_2/O_2$; the etching gas for the first insulating layer 23 can be selected from $SF_6/O_2$, $Cl_2/O_2$, or $HCl/O_2$; the etching gas for the semiconductor layer 24 and the ohmic contact layer 25 can be selected from $SF_6/Cl_2$ or $SF_6/HCl$.

Figure 6:
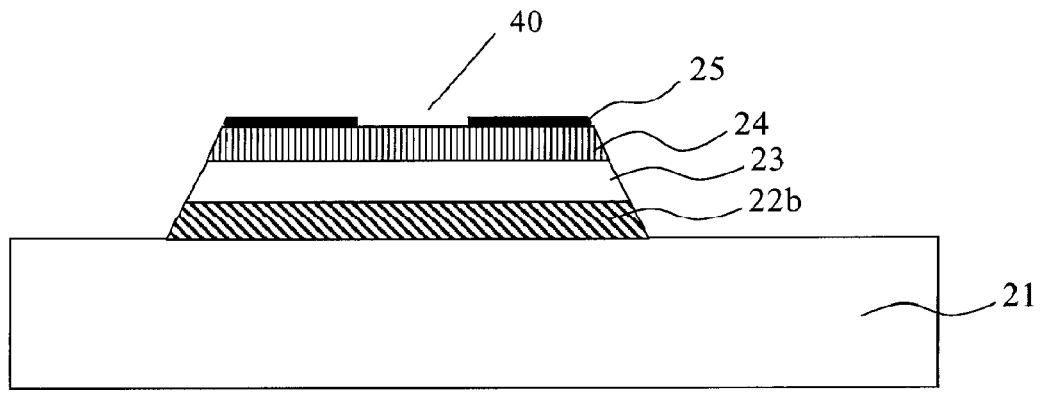
FIG. 6 is a cross-sectional view along the line 2-2 showing the array substrate after etching the ohmic contact layer with a gray tone photoresist pattern which has been subject to an ashing process according to the first embodiment.

After the multiple-step dry etching, an ashing process can be performed on the photoresist pattern to remove the photoresist in the photoresist partially retained region. The ashing gas can be selected from $SF_6$, $O_2$, or a mixed gas of $SF_6/O_2$. At the same time, the photoresist in the photoresist fully retained region is also partially removed and reduced in thickness. After the ashing process, the photoresist in the photoresist partially retained region is removed to expose the ohmic contact layer 25 in the channel of the TFT to be formed. The exposed ohmic contact layer is then etched in a dry etching process to expose the underlying semiconductor layer 24, so as to form the channel 40 of the TFT, as shown in FIG. 6. The etching gas can be selected from $SF_6/Cl_2$ or $SF_6/HCl$. Over-etching is generally performed in order to completely etch the ohmic contact layer in the channel.

Figure 7:
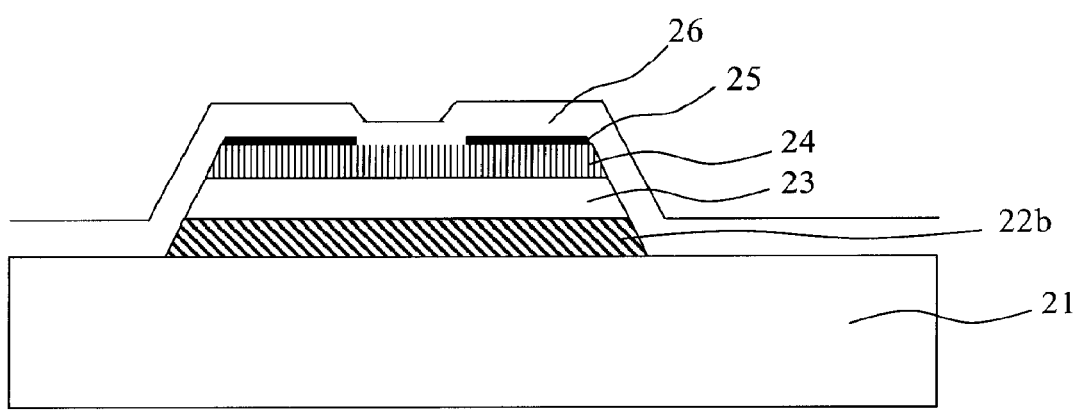
FIG. 7 is a cross-sectional view along the line 2-2 showing the array substrate after depositing a second insulating layer on the substrate, the semiconductor layer, and the ohmic contact layer according to the first embodiment.

After forming of the TFT channel, the remaining photoresist pattern is removed, and a second insulating layer 26 with a thickness of about 2500 Å is then deposited by PECVD on the exposed surface of the substrate 21, the ohmic contact layer 25, and the exposed portion of the semiconductor layer 24, as shown in FIG. 7. The second insulating layer 26 may comprise oxide, nitride or oxynitride, and the corresponding reactant gases used in the PECVD may be $SiH_4$, $NH_3$ or $N_2$, or $SiH_2Cl_2$, $NH_3$ or $N_2$. Since the second insulating layer 26 directly covers the channel of the TFT, it acts to protect the TFT channel.

Figure 8:
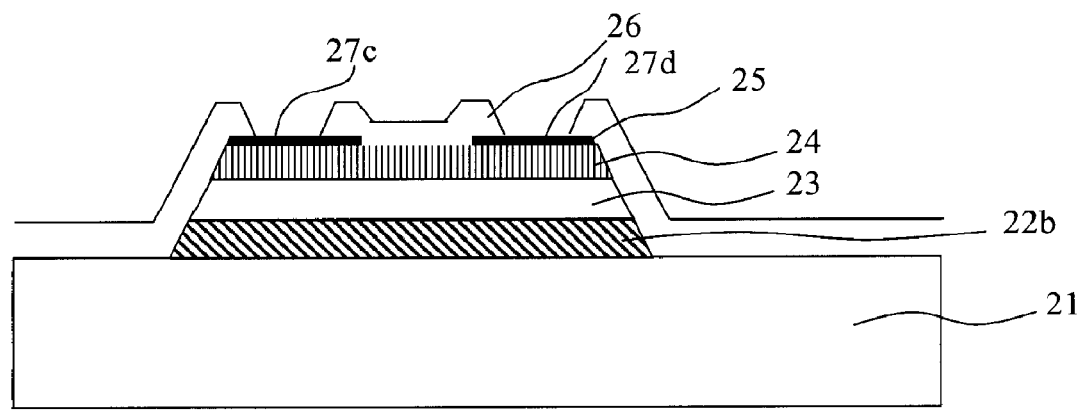
FIG. 8 is a cross-sectional view along the line 2-2 showing the array substrate after etching a portion of the second insulating layer on the ohmic contact layer via a second photolithography according to the first embodiment.

Next, the second insulating layer 26 is patterned to form the source electrode via hole and the drain electrode via hole. For example, the second insulating layer 26 is coated with a photoresist layer (not shown), and the exposure, development, and etching are performed with the second mask, e.g., a conventional mask, to etch a portion of the second insulating layer 26 on the ohmic contact layer 25 to expose the underlying ohmic contact layer 25, so as to form the source electrode via hole 27c and the drain electrode via hole 27d, as shown in FIG. 8. Here, the etching method may be dry etching, and the etching gases can be selected from $SF_6/O_2$, $Cl_2/O_2$, or $HCl/O_2$.

After patterning the second insulating layer 26, a source/drain metal layer (not shown) with a thickness of about 2200 Å is deposited on the array substrate as shown in FIG. 8 by sputtering or thermal evaporation, and the source/drain metal layer also fills the source electrode via hole 27c and the drain electrode via hole 27d formed in the second insulating layer 26. The source/drain metal layer may be a single-layer film of Cr, W, Ti, Ta, Mo, Al, or Cu, or a composite film of any combination of Cr, W, Ti, Ta, Mo, Al, and Cu.

Figure 9:
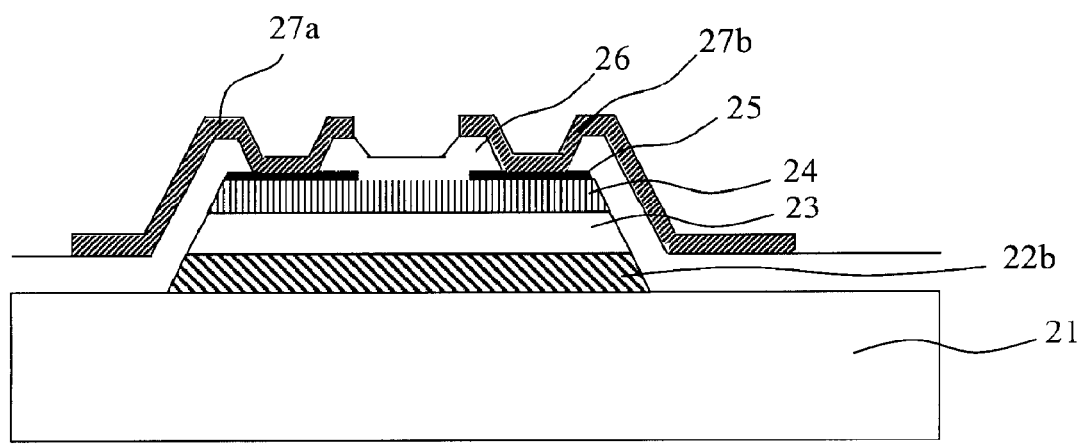
FIG. 9 is a cross-sectional view along the line 2-2 showing the array substrate after forming a source electrode and a drain electrode via a third photolithography according to the first embodiment.

Next, the source/drain metal layer is patterned to form the source electrode 27a and the drain electrode 27b. The source/drain metal layer is coated with a photoresist layer, and the exposure, development, and etching are performed with the third mask, e.g., a conventional mask, to etch source/drain metal layer, so as to form the source electrode 27a and the drain electrode 27b filling the source electrode via hole 27c and the drain electrode via hole 27d, respectively, as well as the data line 32 connected with the source electrode 27a, as shown in FIG. 9. The etching method may be dry etching or wet etching. The resultant source electrode 27a and the drain electrode 27b contact the ohmic contact layer 25 in the source region and the drain region via the source electrode via hole 27c and the drain electrode via hole 27d, respectively.

After forming of the source electrode 27a and the drain electrode 27b as shown in FIG. 9, a passivation layer 28 is deposited by PECVD on the substrate shown in FIG. 9 to a thickness of about 2000 Å (see FIGS. 2-3). The passivation layer 28 may comprise oxide, nitride or oxynitride, and the reactant gases used in the PECVD may be $SiH_4$, $NH_3$ or $N_2$, or $SiH_2Cl_2$, $NH_3$ or $N_2$. Then the passivation layer 28 is coated with a photoresist layer (not shown), the masking and exposure are performed on the passivation layer 28 with the fourth mask, e.g., a conventional mask, and etching is performed on the passivation layer 28 with the patterned photoresist layer as an etching mask so as to pattern the passivation layer 28 (see FIGS. 2-3). Thus, the channel of the TFT is covered with the second insulating layer 26 and the passivation layer 28.

After patterning the passivation layer 28 by etching, the photoresist on the passivation layer is not removed, and then a transparent pixel electrode material layer 29 with a thickness of about 400 Å is deposited on the resultant array substrate by sputtering or thermal evaporation (see FIGS. 2-3). The pixel electrode material layer 29 may include indium tin oxide (ITO), indium zinc oxide (IZO), etc. A chemical solution is used to strip off the photoresist as well as the transparent pixel electrode material layer 29 deposited thereon to form the pixel electrode 31 (see FIG. 2), thus completing the TFT-LCD array substrate, as shown in FIG. 1.

In addition, in an example of the first embodiment, when the second insulating layer 26 is etched to form the source electrode via hole 27c and the drain electrode via hole 27d, a portion of the second insulating layer 26 over the gate line 22a between the neighboring pixels is etched to form a recess (not shown) over the gate line, and the etching can continually be performed on the ohmic contact layer 25 and the semiconductor layer 24 under the recess to form a groove 30 (see FIGS. 1 and 3). Alternatively, during patterning of the passivation layer 28, after the passivation layer 28 is etched, the etching can continually be performed on the ohmic contact layer 25 and the semiconductor layer 24 under the recess to form the groove 30. In the latter case, the transparent pixel electrode material layer 29 can still be retained in the groove 30 after the transparent pixel electrode material layer 29 on the passivation layer is stripped off, as shown in FIG. 3.

Thus the TFT-LCD array substrate according to the first embodiment of the present invention is completed.

The Second Embodiment

Figure 10:
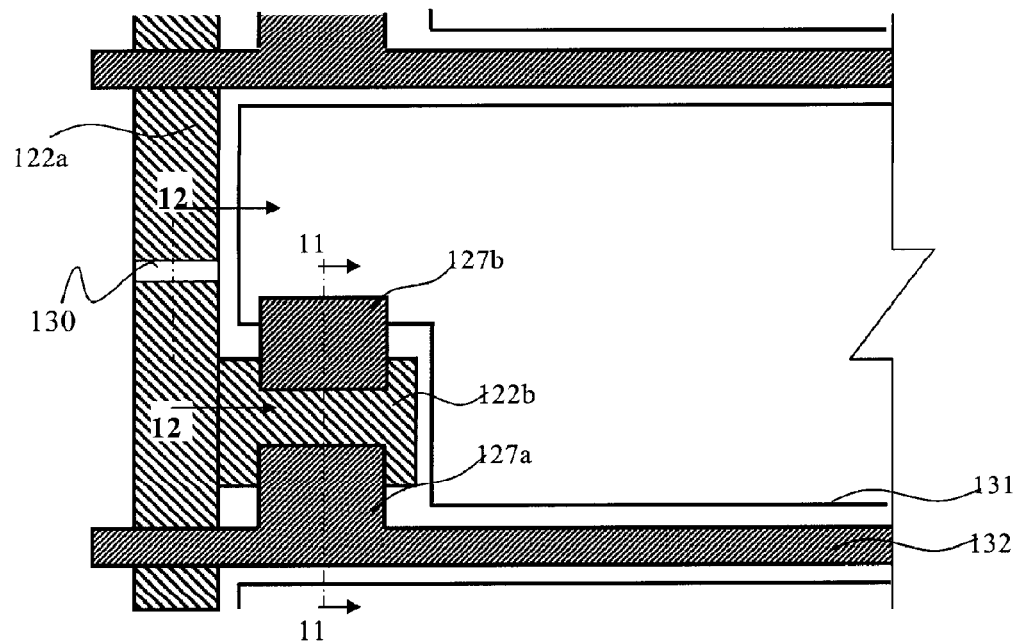
FIG. 10 is a schematic view showing a pixel unit in the TFT-LCD array substrate according to a second embodiment of the present invention.
Figure 11:
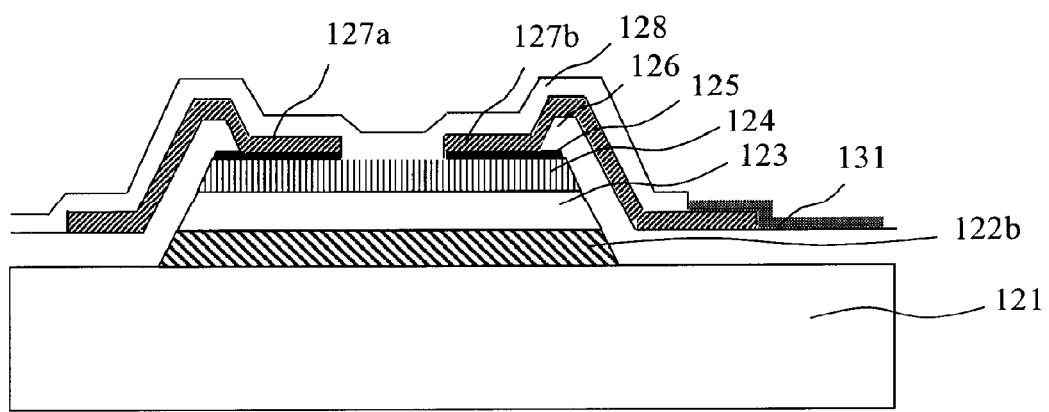
FIG. 11 is a partial cross-sectional view along the line 11-11 in FIG. 10.
Figure 12:
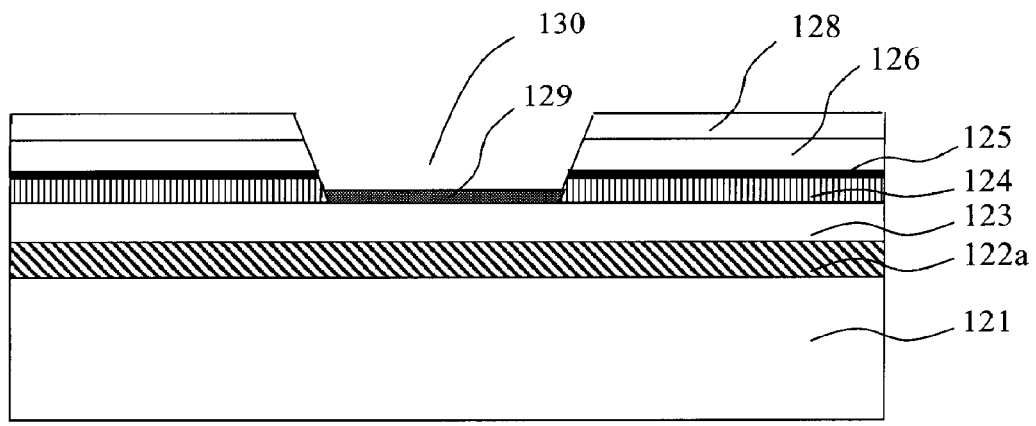
FIG. 12 is a partial cross-sectional view along the line 12-12 in FIG. 10.

FIG. 10 is a schematic view showing a pixel unit in the TFT-LCD array substrate according to the second embodiment of the present invention. FIG. 11 is a partial cross-sectional view along the line 11-11 in FIG. 10. FIG. 12 is a partial cross-sectional view along the line 12-12 in FIG. 10.

As shown in FIGS. 10, 11, and 12, the TFT-LCD array substrate according to the second embodiment of the present invention comprises: a substrate (e.g., a transparent substrate) 121; a gate line 122a and a gate electrode 122b connected thereto that are formed on the substrate 121; a first insulating layer 123, a semiconductor layer 124, and an ohmic contact layer 125 formed sequentially on the gate line 122a and the gate electrode 122b, with the ohmic contact layer 125 being formed on the source region and the drain region over the semiconductor layer 124 and exposing the channel; a second insulating layer 126, formed on the substrate 121 and covering the sidewalls of the gate line 122a and gate electrode 122b, the first insulating layer 123, the semiconductor layer 124, and the ohmic contact layer 125; a data line 132 and a source electrode 127a connected thereto, formed on the second insulating layer 126 and contacting the ohmic contact layer 125 in the source region; a drain electrode 127b, formed on the second insulating layer 126 and contacting the ohmic contact layer 125 in the drain region; a passivation layer 128 formed on the data line 132, the source electrode 127a, and the drain electrode 127b; a pixel electrode 131, formed on the second insulating layer 126 and connected with the drain electrode 127b. Here, the gate line 122a and the data line 132 intersect with each other to define a pixel region on the substrate, and the passivation layer 128 is formed directly on the channel region.

In an example according to the second embodiment of the present invention, a groove 130 is formed over the gate line 122a between the neighboring data lines 132, and the groove 130 cuts off the ohmic contact layer 125 and the semiconductor layer 124 over the gate line 122a to prevent the cross-talk between the neighboring gate lines 122a. In another example, the first insulating layer 123 exposed in the groove 130 is covered with a pixel electrode material layer 129.

FIGS. 13-18 show a method of manufacturing a TFT-LCD array substrate with a 4Mask process according to the second embodiment of the present invention. In the second embodiment, the elements like those in the first embodiment are indicated with the like reference numbers and can be formed with the same materials and methods, the description of which thus will not be repeated thereafter.

A gate metal layer 122 with a thickness of about 3600 Å is deposited to on a substrate 121 by sputtering or thermal evaporation. A first insulating layer 123 with a thickness of about 4000 Å, a semiconductor layer 124 with a thickness of about 1800 Å, and an ohmic contact layer 125 with a thickness of about 500 Å are sequentially deposited on the gate metal layer 122 by PECVD, as shown in FIG. 13.

Figure 14:
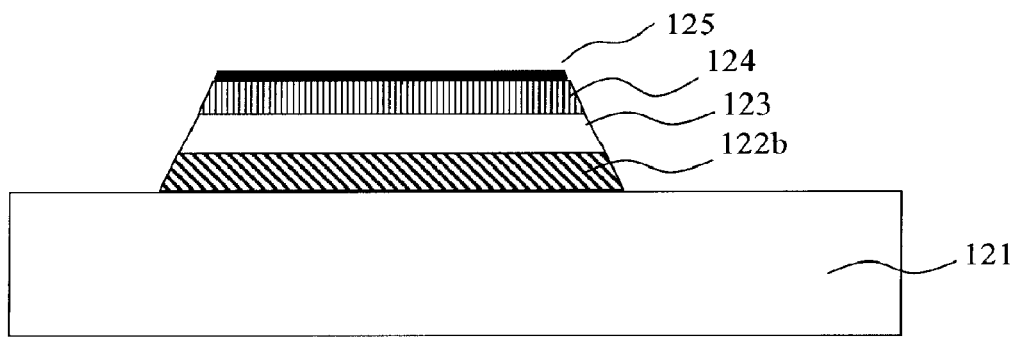
FIG. 14 is a cross-sectional view along the line 11-11 showing the array substrate after etching the gate metal layer, the first insulating layer, the semiconductor layer, and the ohmic contact layer with a gray tone photoresist pattern according to the second embodiment.
Figure 15:
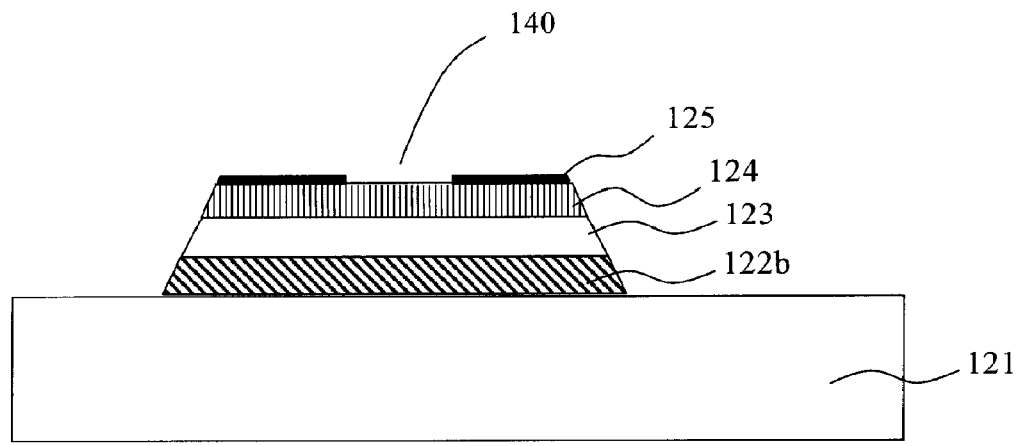
FIG. 15 is a cross-sectional view along the line 11-11 showing the array substrate after etching the ohmic contact layer with the gray tone photoresist pattern which has been subject to an ashing process according to the second embodiment.

In a similar manner, patterning is performed on the gate metal layer 122, the first insulating layer 123, the semiconductor layer 124, and the ohmic contact layer 125 deposited on the substrate 121 with a gray tone mask, to form the gate pattern (gate line and gate electrode) and form the channel 140 of the TFT, as shown in FIGS. 14-15.

Figure 13:
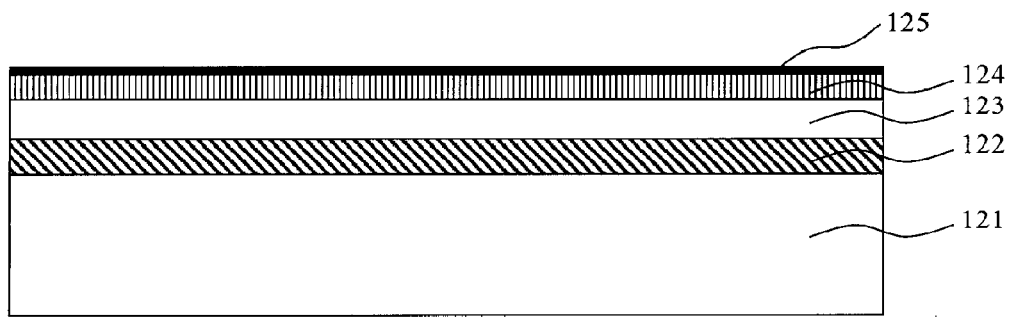
FIG. 13 is a cross-sectional view along the line 11-11 showing the array substrate after sequentially depositing a gate metal layer, a first insulating layer, a semiconductor layer, and an ohmic contact layer according to the second embodiment.

A photoresist layer (e.g., positive photoresist, not shown) is coated on the stacked layers as shown in FIG. 13, and then the exposure and development are performed on the photoresist layer with the gray tone mask to form a gray tone photoresist pattern, which comprises: a photoresist fully retained region, which corresponds to the portion of the array substrate where the gate line and gate electrode will be formed; a photoresist partially retained region, which corresponds to the portion of the array substrate where the channel of the TFT will be formed; and a photoresist-free region.

Multiple-step dry etching is performed with the above photoresist pattern as an etching mask, to etch the ohmic contact layer 125, the semiconductor layer 124, the first insulating layer 123, and the gate metal layer 122 that correspond to the photoresist-free region in the photoresist pattern, so as to form the gate line 122a and the gate electrode 122b, as shown in FIG. 14. Thereafter, an ashing process is performed on the photoresist pattern to remove the photoresist in the photoresist partially retained region, and reduce the thickness of the photoresist in the photoresist fully retained region. After the ashing process, the exposed ohmic contact layer is etched to expose the underlying semiconductor layer 124, so as to form the channel 140 of the TFT, as shown in FIG. 15. Overetching is performed to completely remove the ohmic contact layer in the channel.

Figure 16:
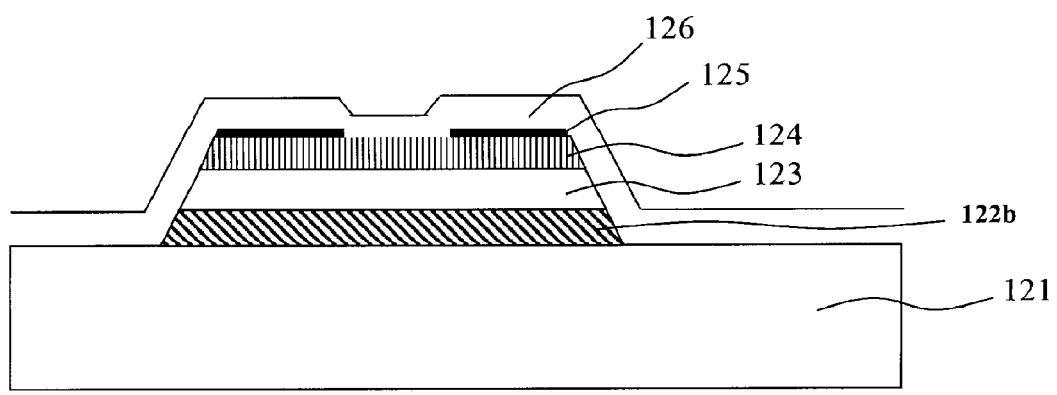
FIG. 16 is a cross-sectional view along the line 11-11 showing the array substrate after depositing a second insulating layer on the substrate, the semiconductor layer, and the ohmic contact layer according to the second embodiment.

After forming of the channel of the TFT, the remain photoresist pattern is removed, and a second insulating layer 126 with a thickness of about 2500 Å is deposited by PECVD on the exposed surface of the substrate 121, the ohmic contact layer 125 and the exposed portion of the semiconductor layer 124, as shown in FIG. 16. Next, the second insulating layer 126 is patterned to expose the ohmic contact layer 125 in the source region and the drain region of the TFT to be formed as well as the channel, as shown in FIG. 17.

Figure 17:
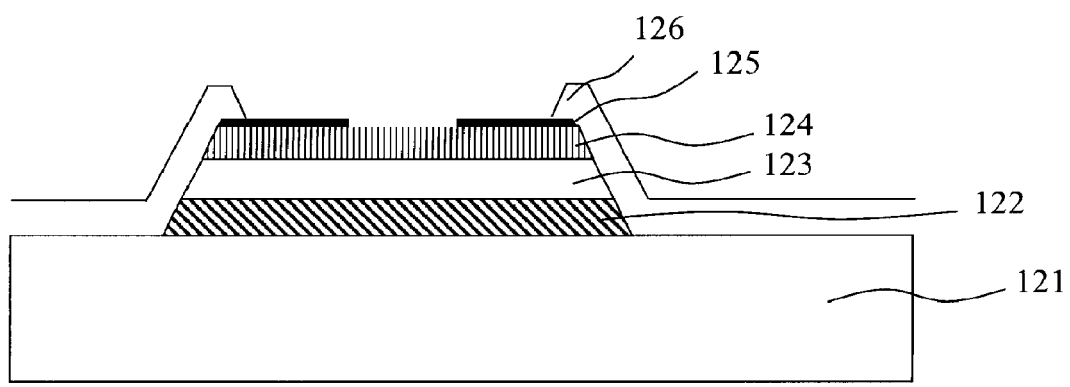
FIG. 17 is a cross-sectional view along the line 11-11 showing the array substrate after etching a portion of the second insulating layer on the ohmic contact layer via a second photolithography according to the second embodiment.
Figure 18:
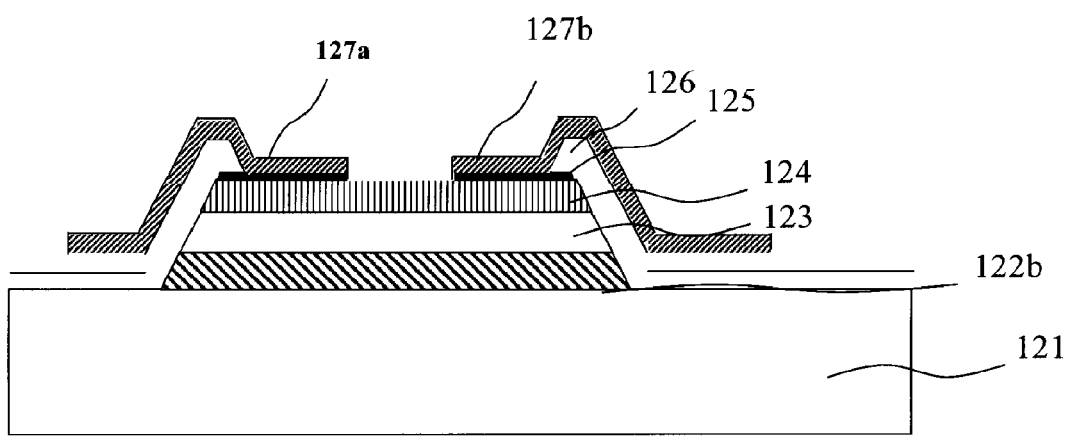
FIG. 18 is a cross-sectional view along the line 11-11 showing the array substrate after forming a source electrode and a drain electrode via a third photolithography according to the second embodiment.

After patterning the second insulating layer 126, a source/drain metal layer with a thickness of about 2200 Å is deposited on the array substrate as shown in FIG. 17 by sputtering or thermal evaporation. Next, the source/drain metal layer is patterned to form the source electrode 127a and the drain electrode 127b, as shown in FIG. 18. The source electrode 127a and the drain electrode 127b contact the ohmic contact layer 125 in the source region and the drain region, respectively.

After forming of the source electrode 127a and the drain electrode 127b, a passivation layer 128 is deposited by PECVD to a thickness of about 2000 Å (see FIGS. 11-12). The passivation layer 128 is patterned to form a passivation pattern (see FIGS. 11-12). At this point, the channel is directly covered by the passivation layer 128.

After patterning the passivation layer 128 by etching, the photoresist on the passivation layer 28 is not removed, and then a transparent pixel electrode material layer 129 with a thickness of about 400 Å is deposited on the resultant array substrate by sputtering or thermal evaporation (see FIGS. 11-12). The pixel electrode material layer 129 may comprise ITO or IZO. A chemical solution is used to strip off the photoresist as well as the transparent pixel electrode material layer 129 deposited thereon to form the pixel electrode 131 (see FIG. 11), thus completing the TFT-LCD array substrate, as shown in FIG. 10.

Similarly, in an example of the second embodiment, when the second insulating layer 126 is etched to expose the ohmic contact layer 125 in the source region and the drain region, a portion of the second insulating layer 126 over the gate line 122a between the neighboring pixels is etched to form a recess (not shown) over the gate line, and the etching can continually be performed on the ohmic contact layer 125 and the semiconductor layer 124 under the recess to form a groove 130 (see FIGS. 10 and 12); alternatively, during patterning of the passivation layer 128, after the passivation layer 128 is etched, the etching can continually be performed on the ohmic contact layer 125 and the semiconductor layer 124 under the recess to form from the groove 130. In the latter case, the transparent pixel electrode material layer 129 can still be retained in the groove 130 after the transparent pixel electrode material layer 129 on the passivation layer is stripped off, as shown in FIG. 12.

Thus the TFT-LCD array substrate according to the second embodiment of the present invention is completed.

From the above description, it should be noted that in the exemplary manufacturing methods of the first and second embodiments of the present invention, the channel can be completed by only ashing photoresist and etching the ohmic contact layer, which greatly simplifies the manufacturing process of the channel of the TFT, significantly reduces defects such as channel residue, short circuit of the channel, rough surface of the channel, ESD, and the like and thus improves the yield of the TFT array substrate.

Furthermore, the process of forming the passivation layer and the pixel electrode with a photolithography process and a stripping off process according to the first and second embodiments is simple and practical and can save a lot of chemical solutions.

It should be appreciated that the embodiments described above are intended to illustrate but not limit the present invention. Although the present invention has been described in detail herein in connection with the preferred embodiments, it should be understood by those skilled in the art that the present invention can be realized with different material and equipment as necessary, and that various modification and equivalents thereof can be made herein without departing from the spirit and scope of the present invention as defined in the appended claims.

What is claimed is:

1. A thin film transistor liquid crystal display (TFT-LCD) array substrate, comprising:
    a substrate:
    a gate line and a data line formed on the substrate and intersecting with each other to define a pixel region;
    a pixel electrode formed in the pixel region; and
    a TFT that is formed on the substrate and has a gate electrode connected with the gate line, a source electrode connected with the data line, and a drain electrode connected with the pixel electrode,
    wherein a first insulating layer, a semiconductor layer, and an ohmic contact layer are formed sequentially on the gate line and the gate electrode, and the ohmic contact layer is formed on a source region and a drain region of the semiconductor layer and exposes a channel;
    wherein a second insulating layer is formed on the substrate, covers the sidewalls of the gate line and gate electrode, the first insulating layer, the semiconductor layer, and the ohmic contact layer, and exposes the ohmic contact layer in the source region and the drain region;
    wherein the data line, the source electrode, the pixel electrode, and the drain electrode are formed on the second insulating layer, and the source electrode and the drain electrode contact the ohmic contact layer in the source region and the drain region through the exposure in the second insulating layer, respectively; and
    wherein a passivation layer is formed on the TFT, the gate line and the data line, and exposes the pixel electrode.

2. The array substrate according to claim 1, further comprising a groove formed over the gate line, which cuts off the ohmic contact layer and the semiconductor layer over the gate line and exposes the first insulating layer.

3. The array substrate according to claim 2, wherein a pixel electrode material layer is formed on the first insulating layer exposed in the groove.

4. The array substrate according to claim 1, wherein the second insulating layer covers the channel, and forms the source electrode via hole and the drain electrode via hole which expose the ohmic contact layer in the source region and the drain region, respectively.

5. The array substrate according to claim 1, wherein the passivation layer covers the channel.

6. The array substrate according to claim 1, wherein the gate line, the gate electrode, the source electrode, the data line, and the drain electrode comprise a single-layer film of Cr, W, Ti, Ta, Mo, Al, or Cu, or a composite film of any combination of Cr, W, Ti, Ta, Mo, Al, and Cu.

7. The array substrate according to claim 1, wherein the first insulating layer, the second insulating layer, and the passivation layer comprise oxide, nitride or oxynitride.

8. A method for manufacturing a TFT-LCD array substrate, comprising steps of:
depositing sequentially on a substrate a gate metal layer, a first insulating layer, a semiconductor layer, and an ohmic contact layer and patterning the layers to form a gate line, a gate electrode, and a channel of a TFT on the substrate;
depositing a second insulting layer and patterning the second insulating layer to expose the ohmic contact layer in the source region and the drain region of the TFT;
depositing a source/drain metal layer, including over the second insulating layer, and patterning the source/drain metal layer to form a data line, a source electrode, and a drain electrode, wherein the data line and the gate line intersect with each other to define a pixel region, and the source electrode and the drain electrode contact the ohmic contact layer in the source region and the drain region through the exposure in the second insulating layer, respectively; and
depositing a passivation layer, and after patterning the passivation layer with a photoresist, depositing a pixel electrode material layer, and stripping off the photoresist as well as the pixel electrode material layer on the photoresist to form a pixel electrode.

9. The method according to claim 8, wherein the gate metal layer, the first insulating layer, the semiconductor layer, and the ohmic contact layer are patterned with a gray tone mask to form the gate line, the gate electrode and the channel of the TFT.

10. The method according to claim 9, wherein a gray tone photoresist pattern is formed on the substrate with the gray tone mask, the gray tone photoresist pattern comprises a photoresist fully retained region which corresponds to the gate line and gate electrode, a photoresist partially retained region which corresponds to the channel of the TFT, and a photoresist-free region.

11. The method according to claim 10, wherein the gate metal layer, the first insulating layer, the semiconductor layer and the ohmic contact layer are patterned with the gray tone photoresist pattern to form the gate line, and the gate electrode, the photoresist pattern is processed to remove the photoresist partially retained region and reduce the thickness of the photoresist fully retained region, and the ohmic contact layer is patterned to form the channel of the TFT.

12. The method according to claim 11, wherein after the removing the photoresist partially exposed region, over-etching is performed on the ohmic contact layer to form the channel of the TFT.

13. The method according to claim 8, wherein the second insulating layer covers the channel after patterning and forms the source electrode via hole and the drain electrode via hole to expose the ohmic contact layer in the source region and the drain region, respectively.

14. The method according to claim 8, wherein the second insulating layer exposes the source region and the drain region, and covers the channel, after patterning.

15. The method according to claim 8, wherein patterning the second insulating layer comprises forming a recess in the second insulating layer over the gate line to expose the ohmic contact layer, and patterning the passivation layer comprises removing the passivation layer over the recess and removing the ohmic contact layer and the semiconductor layer to expose the first insulating layer, so as to form a groove.

16. The method according to claim 15, wherein after stripping off the pixel electrode material layer on the passivation layer, the pixel electrode material layer is retained on the first insulating layer exposed in the groove.

17. The method according to claim 8, wherein patterning the second insulating layer comprises etching a portion of the second insulating layer over the gate line to form a recess and removing the ohmic contact layer and the semiconductor layer to expose the first insulating layer, so as to form a groove.

18. A TFT-LCD array substrate, comprising:
a substrate;
a gate line and a data line formed on the substrate and intersecting with each other to define a pixel region;
a pixel electrode formed in the pixel region; and
a TFT that is formed on the substrate and has a gate electrode connected with the gate line, a source electrode connected with the data line, and a drain electrode connected with the pixel electrode,
wherein a first insulating layer, a semiconductor layer, and an ohmic contact layer are formed sequentially on the gate line and the gate electrode, and the ohmic contact layer is formed on a source region and a drain region of the semiconductor layer and exposes a channel;
wherein a second insulating layer is formed on the substrate, covers the sidewalls of the gate line and gate electrode, the first insulating layer, the semiconductor layer, and the ohmic contact layer, and exposes the ohmic contact layer in the source region and the drain region;
wherein the data line, the source electrode, the pixel electrode, and the drain electrode are formed on the second insulating layer, and the source electrode and the drain electrode contact the ohmic contact layer in the source region and the drain region through the exposure in the second insulating layer, respectively;
wherein a passivation layer is formed on the TFT, the gate line, and the data line and exposes the pixel electrode; and
wherein a groove is formed over the gate line, which cuts off the ohmic contact layer and the semiconductor layer over the gate line and exposes the first insulating layer.

19. The array substrate according to claim 18, wherein the second insulating layer covers the channel and forms a source electrode via hole and a drain electrode via hole which expose the ohmic contact layer in the source region and the drain region, respectively.

20. The array substrate according to claim 18, wherein the passivation layer covers the channel.

* * * * *